(12) United States Patent
Park et al.

(10) Patent No.: US 8,921,841 B2
(45) Date of Patent: Dec. 30, 2014

(54) POROUS GLASS SUBSTRATE FOR DISPLAYS AND METHOD OF MANUFACTURING THE SAME

(71) Applicant: Samsung Corning Precision Materials Co., Ltd., Gyeongsangbuk-do (KR)

(72) Inventors: Seong-Sik Park, ChungCheongNam-Do (KR); Jinah Yoo, ChungCheongNam-Do (KR); Tae Won Kim, ChungCheongNam-Do (KR); Jinwoo Han, ChungCheongNam-Do (KR)

(73) Assignee: Samsung Corning Precision Materials Co., Ltd. (KR)

( * ) Notice: Subject to any disclaimer, the term of this patent is extended or adjusted under 35 U.S.C. 154(b) by 0 days.

(21) Appl. No.: 13/888,682

(22) Filed: May 7, 2013

(65) Prior Publication Data
US 2013/0299792 A1    Nov. 14, 2013

(30) Foreign Application Priority Data

May 9, 2012    (KR) .................. 10-2012-0048903
Dec. 10, 2012  (KR) .................. 10-2012-0142443

(51) Int. Cl.
H01L 51/52    (2006.01)

(52) U.S. Cl.
CPC .................. *H01L 51/5268* (2013.01)
USPC ............................................ 257/40

(58) Field of Classification Search
USPC ............................................ 257/40
See application file for complete search history.

(56) References Cited

U.S. PATENT DOCUMENTS

| | | | | |
|---|---|---|---|---|
| 3,760,216 | A * | 9/1973 | Lasser et al. | 313/103 CM |
| 7,410,883 | B2 * | 8/2008 | Gadkaree | 438/455 |
| 2012/0052656 | A1 * | 3/2012 | Bellman et al. | 438/477 |
| 2012/0281338 | A1 * | 11/2012 | Lee et al. | 361/524 |

* cited by examiner

*Primary Examiner* — Thao P Le
(74) *Attorney, Agent, or Firm* — Lerner, David, Littenberg, Krumholz & Mentlik, LLP (57) ABSTRACT

A porous glass substrate for displays and a method of manufacturing the same, with which the optical characteristics of a display such as an organic light-emitting device (OLED) can be improved. The porous glass substrate includes a glass substrate and a porous layer formed in at least one portion of one surface of the glass substrate and extending into the glass substrate, the refractive index of the porous layer being smaller than the refractive index of the glass substrate. The porous layer has a plurality of pores which is formed in the glass substrate such that at least one component of the glass substrate except for silicon dioxide ($SiO_2$) is eluted from the glass substrate.

21 Claims, 7 Drawing Sheets

POROUS GLASS SUBSTRATE FOR DISPLAYS AND METHOD OF MANUFACTURING THE SAME

CROSS REFERENCE TO RELATED APPLICATION

The present application claims priority from Korean Patent Application Numbers 10-2012-0048903 and 10-2012-0142443 filed on May 9, 2012 and Dec. 10, 2012 respectively, the entire contents of which applications are incorporated herein for all purposes by this reference.

BACKGROUND OF THE INVENTION

1. Field of the Invention

The present invention relates to a porous glass substrate for displays and a method of manufacturing the same, and more particularly, to a porous glass substrate for displays and a method of manufacturing the same, with which the optical characteristics of a display such as an organic light-emitting device (OLED) can be improved.

2. Description of Related Art

Figure 6:
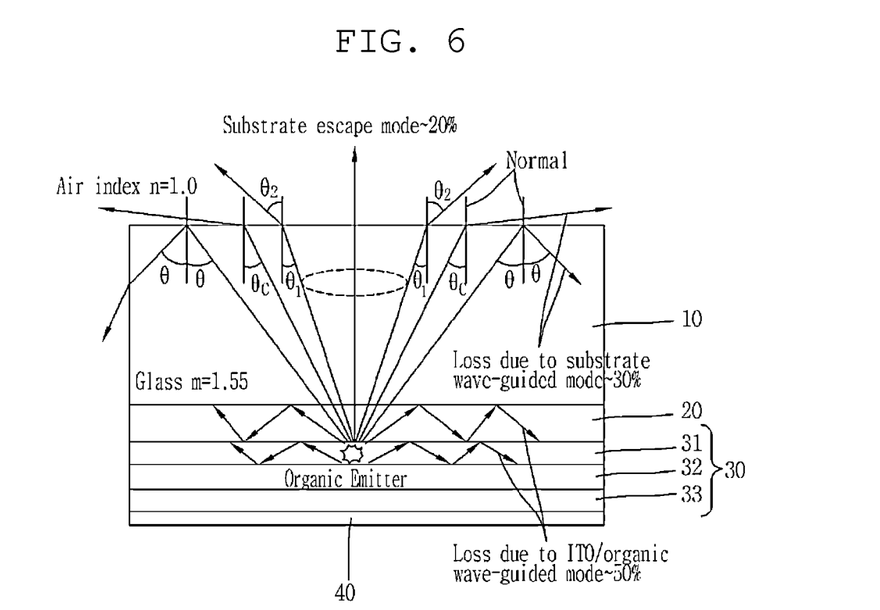
FIG. 6 is a cross-sectional and conceptual view depicting the light extraction efficiency of an OLED of the related art.

FIG. 6 is a cross-sectional and conceptual view depicting the light extraction efficiency of an organic light-emitting device (OLED) of the related art. As shown in FIG. 6, in the OLED of the related art, only about 20% of light generated is emitted to the outside and about 80% of the light is lost by waveguiding due to the different refractive indices of a glass substrate 10, an anode 20 and an organic light-emitting layer 30 which includes a hole injection layer, a hole carrier layer, a light-emitting layer, an electron carrier layer and an electron injection layer and by total internal reflection due to the difference in the refractive indices between the glass substrate 10 and air. Specifically, the refractive index of the inside organic light-emitting layer 30 ranges from 1.7 to 1.8, and the refractive index of indium tin oxide (ITO) that is typically used for the anode 20 ranges from 1.9 to 2.0. The two layers have a very small thickness ranging from about 100 nm to about 400 nm and the refractive index of glass which is used for the glass substrate 10 is about 1.5, whereby a planar waveguide is formed inside the OLED. It is calculated that about 45% of the light is lost by the inside waveguiding due to the above-described reason. In addition, the refractive index of the glass substrate 10 is about 1.5, and the refractive index of the ambient air is 1.0. When the light is directed outward from the inside of the glass substrate 10, a ray of the light having an angle of incidence greater than a critical angle is totally reflected and is trapped inside the glass substrate 10. The ratio of the trapped light is up to about 35%, and thus only about 20% of the generated light is emitted to the outside. Herein, reference numerals 31, 32 and 33 indicate components of the organic light-emitting layer 30. Specifically, 31 indicates the hole injection layer and the hole carrier layer, 32 indicates the light-emitting layer, and 33 indicates the electron injection layer and the electron carrier layer.

Figure 7:
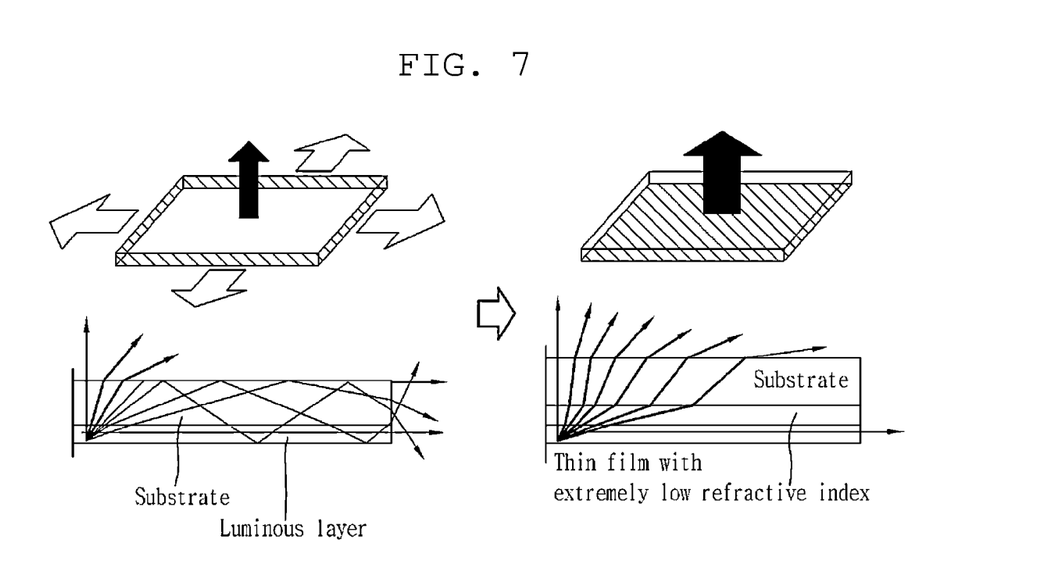
FIG. 7 is an exploded perspective view showing another example of an OLED of the related art.

In the related art, in order to overcome this problem, a silica aerogel film, or a low-refractivity film, is situated as a coating between the glass substrate and the ITO in order to extract light that is trapped by total internal reflection (see FIG. 7). However, the silica aerogel has not been applied to an actual product, since the manufacturing process thereof is complicated, difficult and expensive. In addition, the ability of the silica aerogel to be formed in a thin film is limited, thereby causing the increased thickness of the substrate.

Figure 8:
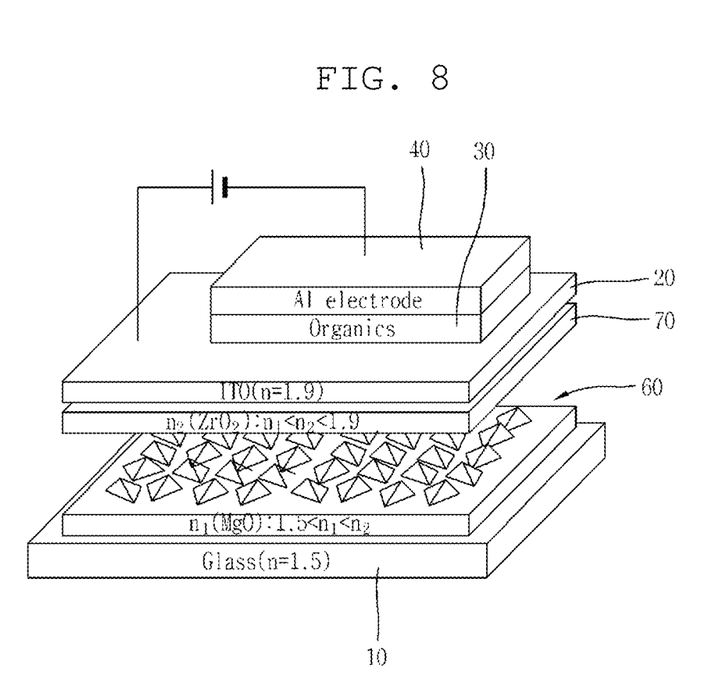
FIG. 8 is an exploded perspective view showing a further example of an OLED of the related art.

In addition, as shown in FIG. 8, in the related art, a concave-convex structure 60 is disposed under the anode 20 (with respect to the paper surface), i.e. in the interface between the anode 20 and the glass substrate 10, in order to enhance light extraction efficiency.

As described above, the anode 20 and the organic light-emitting layer 30 generally act as one light waveguide between the cathode 40 and the glass substrate 10. Accordingly, in the state in which the anode 20 and the organic light-emitting layer 30 act in a waveguide mode, when the concave-convex structure 60 which causes light scattering is formed in the interface adjacent to the anode 20, the waveguide mode is disturbed, so that the quantity of light that is extracted to the outside is increased. However, when the concave-convex structure 60 is formed below the anode 20, the shape of the anode 20 resembles the shape of the concave-convex structure 60 below the anode 20, thereby increasing the possibility that a sharp portion may be localized. Since the OLED has a stacked structure of very thin films, when the anode 20 has a sharp protruding portion, current is concentrated in that portion, which acts as a reason for large leakage current or decreases power efficiency. Accordingly, in order to prevent such deterioration in the electrical characteristics, a flat film 70 is necessarily added when the concave-convex structure 60 is formed below the anode 20. The flat film 70 serves to make the convex and concave portions of the concave-convex structure 60 be flat. When the flat film 70 is not flat and has sharp protruding portions, the anode 20 also has protruding portions, which cause leakage current. Therefore, the flatness of the flat film 70 is very important and is required to be about Rpv=30 nm or less.

In addition, the flat film 70 is required to be made of a material, the refractive index of which is similar to that of the anode 20. If the refractive index of the flat film 70 is low, most light is reflected at the interface between the anode 20 and the flat film 70 before being disturbed by the concave-convex structure 60. The light is then trapped between the anode 20 and the organic light-emitting layer 30, which is referred to as the waveguide mode. The flat film 70 is required to be as thin as possible. If the flat film 70 is too thick, more light may be unnecessarily absorbed, and the effect of scattering may be decreased since the distance between the concave-convex structure 60 and the organic light-emitting layer 30 is too large.

However, the process of completely flattening the concave-convex structure 60 using the thin flat film 70 having a thickness of several hundreds of nm is very difficult. In addition, the methods of covering and flattening the concave-convex structure 60 include deposition coating and solution coating. Since the deposition coating is characterized by forming a film following the shape of the concave-convex structure 60, the solution coating is better than the deposition coating when forming the flat film 70. However, at present, it is very difficult to obtain a solution coating material that has a high refractive index, i.e. a refractive index that is equal to or greater than the refractive index of the ITO anode 20, and that satisfies process conditions for polycrystalline thin-film transistors, such as complicated conditions required on the surface of the OLED substrate and high-temperature processing.

In the related art, a micro-cavity structure was applied to an OLED in order to improve the light extraction efficiency of the OLED. Here, the ITO anode 20, or the transparent electrode, is made of ITO/metal/ITO. In this approach, a part of light is reflected from the anode 20 and micro cavities are formed between the anode 20 and the metal cathode 40 such that the light is subjected to constructive interference and resonance, thereby increasing the light extraction efficiency. However, this micro-cavity structure has the problem of causing color shift in which colors are changed depending on the position of a viewer within the viewing angle.

The information disclosed in the Background of the Invention section is only for better understanding of the background of the invention, and should not be taken as an acknowledgment or any form of suggestion that this information forms a prior art that would already be known to a person skilled in the art.

BRIEF SUMMARY OF THE INVENTION

Various aspects of the present invention provide a porous glass substrate for displays and a method of manufacturing the same, with which the optical characteristics of a display such as an organic light-emitting device (OLED) can be improved.

In an aspect of the present invention, provided is a porous glass substrate that includes: a glass substrate; and a porous layer formed in at least one portion of one surface of the glass substrate and extending into the glass substrate, the refractive index of the porous layer being smaller than the refractive index of the glass substrate. The porous layer has a plurality of pores which is formed in the glass substrate such that at least one component of the glass substrate except for silicon dioxide ($SiO_2$) is eluted from the glass substrate.

In an exemplary embodiment of the invention, the porous layer may have a concave-convex pattern in a surface thereof which faces toward an inside of the glass substrate. The concave-convex pattern may include a plurality of semi-oval shapes.

The pitch of the concave-convex pattern may be equal to or greater than 1 μm or is equal to or less than 200 nm. Alternatively, the pitch of the concave-convex pattern may have random different sizes.

The porous glass substrate may further include a buffer layer stacked on the one surface of the glass substrate, the buffer layer being made of porous glass.

The buffer layer may be made of one selected from among $SiO_2$, $SiN_x$, MgO and $ZrO_2$.

In another aspect of the invention, provided is a method of manufacturing a porous glass substrate that includes the following steps of: preparing a glass substrate; and forming a porous layer in at least one portion of one surface of the glass substrate by eluting at least one component of the glass substrate except for silicon dioxide ($SiO_2$) from the glass substrate, a refractive index of the porous layer being smaller than a refractive index of the glass substrate.

In an exemplary embodiment of the invention, the porous layer may have a concave-convex pattern in a surface thereof which faces toward an inside of the glass substrate.

The concave-convex pattern may be formed via lithography.

The lithography may be implemented as a photolithography process which includes the following steps of: applying photoresist on one surface of the glass substrate; exposing a plurality of areas on the one surface of the glass substrate by patterning the photoresist using a mask; forming the porous layer in an inward direction from the plurality of areas by carrying out elution in the plurality of areas; and removing the patterned photoresist.

The lithography may include the steps of: coating the one surface of the glass substrate with a coating material; forming semispherical nano particles by annealing at a temperature near a melting point of the coating material; patterning the one surface of the glass substrate using the nano particles as a mask so that the porous layer is formed; and removing the nano particles.

The coating material may contain one selected from the group consisting of Ag, Au, Pt, Pd, Co, Ni, Ti, Al, Sn, Cr and alloys thereof.

The coating material may be a polymer or an oxide.

The method may further include the step of, after the step of forming the porous layer, forming a buffer layer on the one surface of the glass substrate, the buffer layer being made of porous glass.

According to another aspect of the invention, provided is a top-emission type OLED that includes: a first glass substrate; a device layer comprising an anode, an organic light-emitting layer and a cathode which are sequentially stacked on the first glass substrate; a second glass substrate disposed on the device layer such that the second glass substrate faces the first glass substrate, the second glass substrate forming a passage through which light generated by the device layer is emitted to an outside; a porous portion formed in at least a portion of one surface of the second glass substrate and extending into the second glass substrate, a refractive index of the porous portion being smaller than a refractive index of the glass substrate; and a bonding layer disposed between the device layer and the second glass substrate to bond the device layer and the second glass substrate to each other.

According to an embodiment of the invention, the one surface of the second glass substrate is the surface that faces the device layer.

The porous portion may be configured as a porous layer which is formed in the entire area of the one surface of the second glass substrate, or as a concave-convex pattern which is formed in predetermined portions of the one surface of the second glass substrate.

The top-emission type OLED may also include a buffer layer disposed between the second glass substrate and the bonding layer.

According to embodiments of the invention, the porous glass substrate has the porous layer formed on the glass substrate, the refractive index of the porous layer being lower than the refractive index of glass. It is therefore possible to increase the light extraction efficiency of an OLED to which the porous glass substrate is applied. This can consequently reduce power consumption, leading to minimized heat generation, thereby increasing the lifespan of the OLED.

In addition, the process of manufacturing the porous glass substrate is easier than the process of forming silica aerogel which is formed as a separate component in the related art.

Furthermore, it is possible to preclude the concave-convex structure of the related art which causes light to scatter at the surface adjacent to the OLED, as well as the process of forming the flat film which is formed to flatten the stepped portions caused by the concave-convex structure, thereby reducing the manufacturing cost. The process and structure can also be simplified, thereby removing the danger of leakage current. Since the thickness is prevented from increasing, the OLED to which the porous glass substrate is applied can have a slim and compact profile.

In addition, since the porous layer has a concave-convex pattern surface consisting of a plurality of semi-oval shapes, the porous glass substrate having the porous layer can promote color mixing, thereby reducing color shift in the OLED.

The methods and apparatuses of the present invention have other features and advantages which will be apparent from, or are set forth in greater detail in the accompanying drawings, which are incorporated herein, and in the following Detailed Description of the Invention, which together serve to explain certain principles of the present invention.

DETAILED DESCRIPTION OF THE INVENTION

Reference will now be made in detail to a porous glass substrate for displays and a method of manufacturing the same of the present invention, embodiments of which are illustrated in the accompanying drawings and described below, so that a person having ordinary skill in the art to which the present invention relates can easily put the present invention into practice.

Throughout this document, reference should be made to the drawings, in which the same reference numerals and signs are used throughout the different drawings to designate the same or similar components. In the following description of the present invention, detailed descriptions of known functions and components incorporated herein will be omitted when they may make the subject matter of the present invention unclear.

Figure 1:
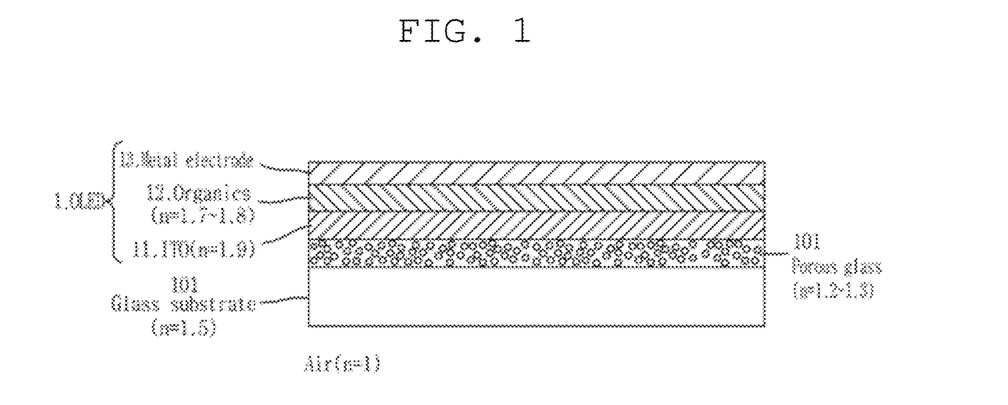
FIG. 1 is a cross-sectional view showing a porous glass substrate according to an embodiment of the invention.

As shown in FIG. 1, a porous glass substrate 100 for displays according to an embodiment of the invention is one of opposing substrates used for an organic light-emitting device (OLED) 1. The porous glass substrate 100 can be a light extraction substrate which is bonded to one surface of the OLED 1. The porous glass substrate 100 protects the OLED 1 from the external environment, and acts as a passage through which light generated by the OLED 1 is emitted to the outside.

Here, the OLED 1 has a stacked structure interposed between the porous glass substrate 100 according to this embodiment of the invention and an encapsulation substrate (not shown) which faces the porous glass substrate 100. The stacked structure includes an anode 11, an organic light-emitting layer 12 and a cathode 13 which are stacked on one another. The anode 11 can be made of a metal or an oxide, such as Au, In, Sn or indium tin oxide (ITO), as it has a significant work function in order to facilitate hole injection. The cathode 13 can be implemented as a metal thin film of Al, Al:Li or Mg:Ag having a small work function in order to facilitate electron injection. In the case of a top emissions structure, the cathode 13 can be implemented as a multilayer structure that includes a semitransparent electrode of a metal thin film made of Al, Al:Li or Mg:Ag and a transparent electrode of an oxide thin film of indium tin oxide (ITO) in order to facilitate the transmission of light generated by the organic light-emitting layer 12. The organic light-emitting layer 12 includes a hole injection layer, a hole carrier layer, a light-emitting layer, an electron carrier layer and an electron injection layer which are sequentially stacked on the anode 11. In this structure, when a forward voltage is applied between the anode 11 and the cathode 13, electrons from the cathode 13 migrate to the light-emitting layer through the electron injection layer and the electron carrier layer, and holes migrate to the light-emitting layer through the hole injection layer and the hole carrier layer. The electrons and holes that have migrated into the light-emitting layer recombine with each other, thereby generating excitons. When such excitons transit from the excited state to the ground state, light is emitted. The brightness of the light emitted is proportional to the amount of current that flows between the anode 11 and the cathode 13.

The porous glass substrate 100 that acts as the light extraction layer of the OLED 1 as above includes a glass substrate 101 and a porous layer 110.

The glass substrate 101 acts to protect the OLED 1 to which it is applied from the external environment. The glass substrate 101 can be made of soda lime glass or alumino-silicate glass. It is preferred that the glass substrate 101 be made of soda lime glass when the OLED 1 to which it is applied is used for illumination and be made of alumino-silicate glass when the OLED 1 to which it is applied is used for a display. The porous layer 110 is formed in one surface of the glass substrate 101, in particular, in at least one portion of one surface of the glass substrate 101 that is bonded to the anode 11 of the OLED 1.

The porous layer 110 is formed in one surface of the glass substrate 101 and extends into the glass substrate 101. When applied to the OLED 1, the porous layer 110 serves to disturb waveguiding inside the OLED 1, whereby more light can be extracted to the outside. In addition, the porous layer 110 is formed such that its refractive index is lower than that of the glass substrate 101. Due to this property, the porous layer 110 redirects any ray of light that is supposed to strike the interface between the porous glass substrate 100 and the air at a critical angle for total internal reflection so that the angle of the light ray becomes smaller than the critical angle. In this fashion, the porous layer 110 acts to increase the amount of light that is extracted to the outside. For this, the porous layer 110 is configured such that its refractive index is lower than that of a material of the glass substrate 101, i.e. glass. The lower refractive index is realized by pores present in the porous layer 110.

The porous layer 110 can be realized by a method of dipping a glass substrate into an elution medium (dissolution medium). The elution medium used in the elution process is implemented as hexafluorosilicic acid ($H_2SiF_6$) which is saturated by the addition of $SiO_2$, and to which a boric acid solution may be added. When $SiO_2$ is oversaturated in the $H_2SiF_6$ solution, $H_2SiF_6 \cdot SiF_4$ is produced. This consequently causes at least one component of the glass substrate, except for $\equiv$Si—O—Si$\equiv$ which has a strong bonding force, to elute. Accordingly, the porous layer 110 having a porous silica structure is formed in the glass substrate 101 such that it extends inward from the surface of the glass substrate 101.

The shape of the porous layer 110 is obtained by eluting at least one component except for $SiO_2$ from the glass substrate, based on the above-described principle. This will be described later in greater detail in the method of manufacturing the substrate for OLEDs.

In the porous layer 110 that is formed in the surface of the glass substrate 101 as described above, one surface of the porous layer 110 forms a planar interface with one surface of the OLED 1, i.e. one source of the anode 11. The pores of the porous layer 110 have a very small diameter of about 20 nm or less, and the surface coarseness of the porous layer 110 is substantially the same as that of the original glass surface. It is therefore possible to fundamentally overcome the problems with the related art caused by the concave-convex structure on the anode, such as leakage current or the decreased uniformity of light due to the stepped portions. It is also possible to preclude an additional complicated process, such as the process of forming the flat film that is intended to flatten the stepped portions.

It is also possible to overcome the problems with the related art caused by the presence of the concave-convex structure and the flat film below the anode. In the related art, for example, the leakage current which occurs due to the low flatness, the light absorption and cost were unnecessarily increased due to the increase in the thickness intended to improve the flatness, and the scattering effect was reduced. The same can also be expected when the porous glass substrate of the invention is applied to photovoltaic cells.

The porous glass substrate 100 for displays according to an embodiment of the invention can include a buffer layer (not shown). The buffer layer (not shown) is a layer which blocks elements, such as alkalis, which can diffuse across the porous glass substrate 100 and have negative effects on devices such as an OLED or thin-film transistor (TFT). The buffer layer (not shown) is stacked on one surface of the glass substrate 101 including the porous layer 110. The buffer layer (not shown) can be made of porous glass, for example, an oxide such as $SiO_2$, $SiN_x$, MgO and $ZrO_2$. However, the present invention does not specifically limit the material for the buffer layer (not shown) to the oxide.

Figure 2:
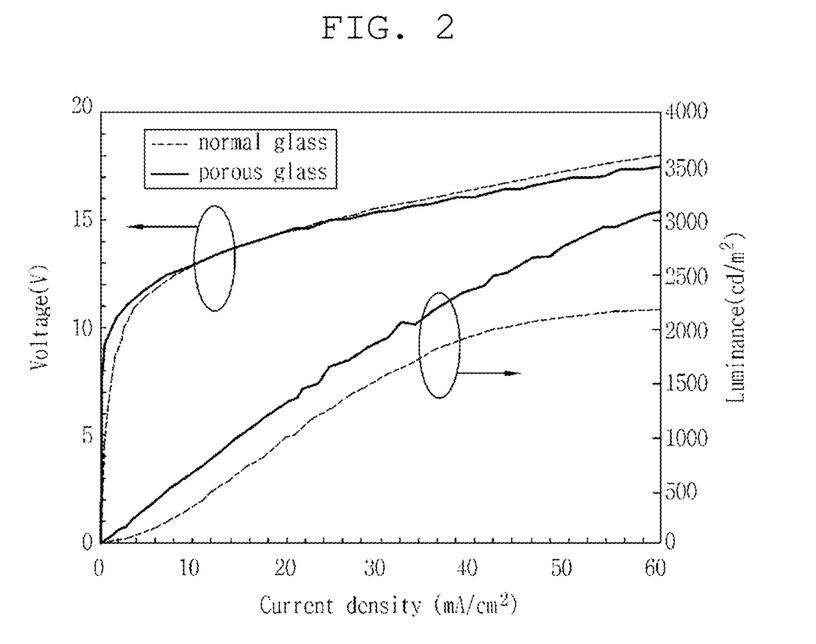
FIG. 2 shows a graph of certain characteristics of an OLED to which the porous glass substrate according to an embodiment of the invention is applied, i.e. voltage and luminance characteristics of the OLED depending on variations in current density.

FIG. 2 is a graph showing certain characteristics of an OLED to which the porous glass substrate according to an embodiment of the invention is applied, i.e. voltage and luminance characteristics of the OLED depending on variations in current density. As shown in FIG. 2, when the porous glass substrate was applied, an increase in light extraction efficiency was observed due to an increase in luminance of up to 43% compared to that of a normal glass substrate, even though the voltage characteristics depending on variation in current density are similar.

Figure 3:
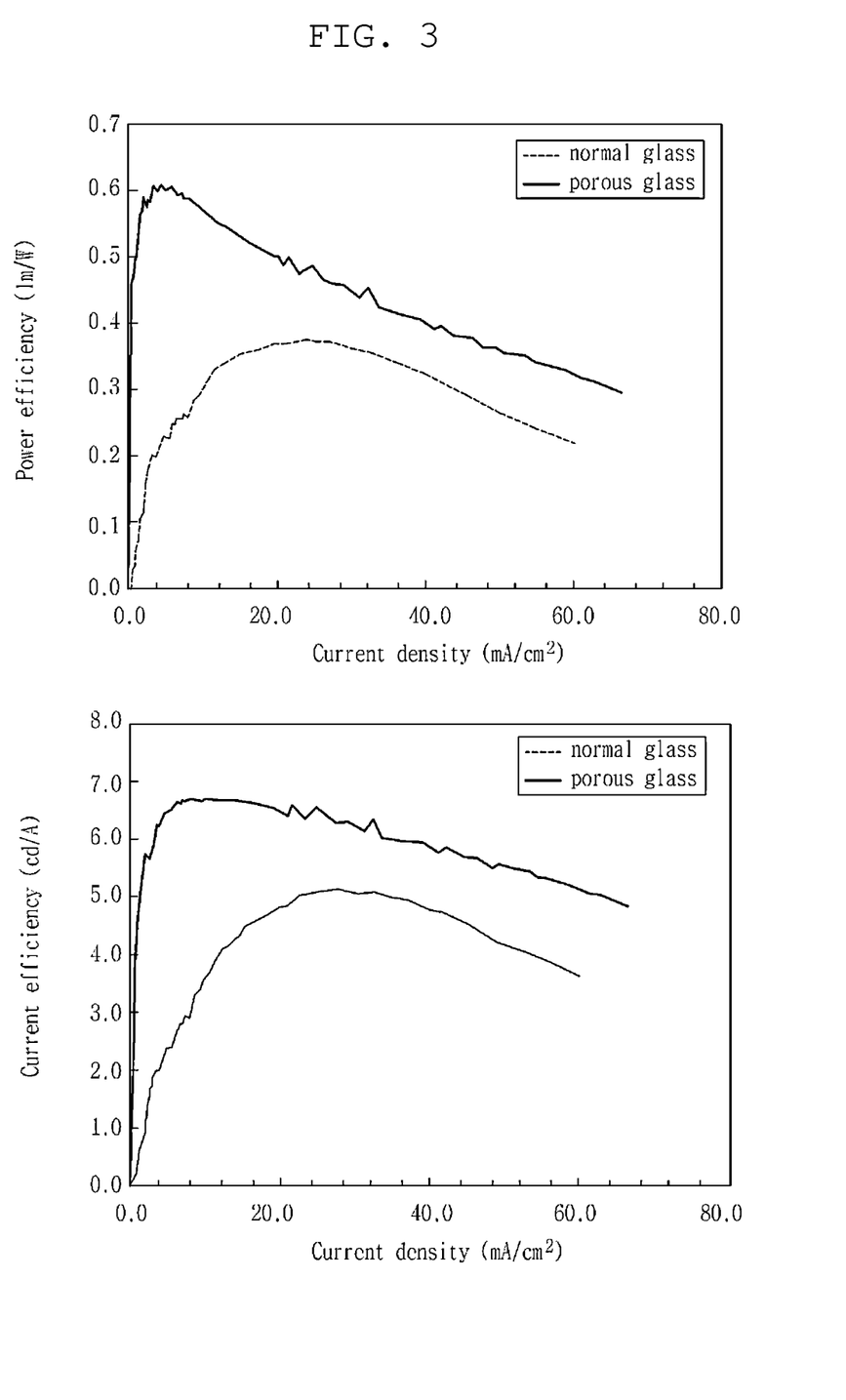
FIG. 3 shows graphs of certain characteristics of an OLED to which the porous glass substrate according to an embodiment of the invention is applied, i.e. power and current efficiencies of the OLED depending on variations in current density.

FIG. 3 shows graphs of certain characteristics of an OLED to which the porous glass substrate according to an embodiment of the invention is applied, i.e. power and current efficiencies of the OLED depending on variations in current density. As shown in FIG. 3, when the porous glass substrate was applied, it was observed that the power efficiency and the current efficiency increased by 43% and 45% respectively, compared to those of a normal glass substrate. This explains that the device characteristics were improved due to the light extraction efficiency of the porous glass substrate over the OLED.

Hereinafter, a porous glass substrate according to another embodiment of the invention will be described with reference to FIG. 4.

Figure 4:
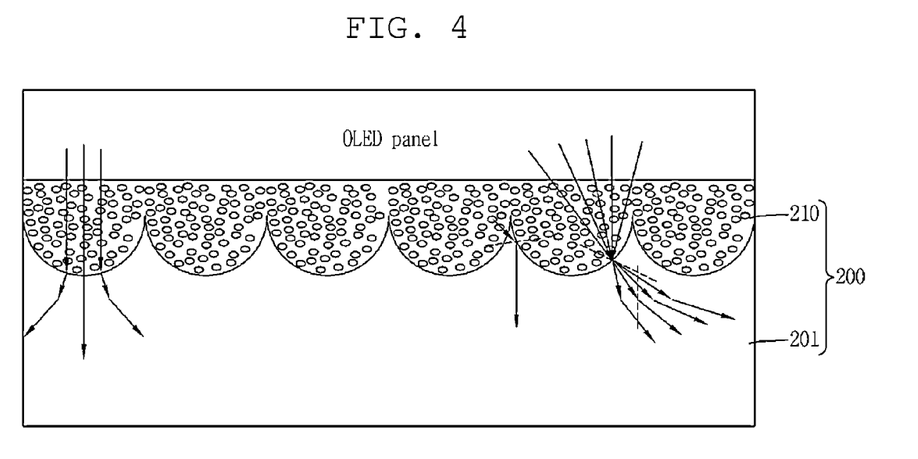
FIG. 4 is a cross-sectional and conceptual view showing a porous glass substrate according to another embodiment of the invention, in which light is refracted and scattered.

FIG. 4 is a cross-sectional and conceptual view showing a porous glass substrate according to this embodiment of the invention, in which light is refracted and scattered.

As shown in FIG. 4, the porous glass substrate 200 according to this embodiment of the invention includes a glass substrate 201 and a porous layer 210.

This embodiment of the invention is substantially identical to the former embodiment of the invention except for the shape of the pattern of the porous layer. Accordingly, detailed descriptions of the same components will be omitted, and the same reference numerals will be used to designate the same components.

The porous layer 210 according to this embodiment of the invention has a concave-convex pattern in one surface thereof which faces toward the inside of the glass substrate. The concave-convex pattern has a plurality of semi-oval shapes.

Like the porous layer 110 according to the former embodiment, the porous layer 210 having the concave-convex pattern according to this embodiment of the invention can be formed by creating pores inside the glass substrate 201 viaelution, such that the refractive index of the porous layer 210 is lower than that of the glass substrate 201. Consequently, the waveguiding mode caused by the anode and the organic light-emitting layer of the OLED 1 is disturbed at the interface between the concave-convex pattern consisting of a plurality of semi-oval shapes and the glass substrate 201. In addition, the porous layer 210 can also redirect a ray of light that is supposed to strike the interface between the glass substrate 201 and the air at a critical angle for total reflection so that the angle of the light ray becomes smaller than the critical angle, thereby increasing the amount of light that is extracted to the outside.

Here, the pitch of the concave-convex pattern consisting of a plurality of semi-oval shapes of the porous layer 210 is required to i) be equal to or greater than about 1 μm which is greater than the wavelength of light emitted from the OLED, or ii) be equal to or smaller than about 200 nm which is smaller than the wavelength of the emitted light. When the size of each semi-oval shape of the concave-convex pattern is similar to the wavelength of the emitted light, it is preferred that the size of the pitch of the pattern is random within the range of the wavelength of the light.

This is because, when a periodic pattern similar to the wavelength of the light emitted from the OLED 1 is formed, the spectrum of the light changes due to the Bragg grating and photonic crystal effects so that color change occurs depending on a change in the position of a viewer within the viewing angle.

In addition, as shown in FIG. 4, the porous layer 210 according to this embodiment of the invention can refract and scatter light that is incident from the OLED 1. Specifically, the concave-convex pattern consisting of semi-oval shapes changes the direction of a ray of light that is emitted in the direction normal to the interface between the OLED 1 and the glass substrate 201 so that the direction of the ray is offset from the normal direction while changing the direction of a ray of light that is emitted in the direction offset from the normal direction so that the direction of the ray is normal to the interface. Accordingly, the concave-convex pattern consisting of semi-oval shapes can change the direction of light depending on the position of the viewer within the viewing angle, so that color shift that occurs in the OLED which has a micro-cavity structure in order to increase the light extraction efficiency by promoting color mixing can be reduced.

A description will be given below of a method of manufacturing a porous glass substrate according to an embodiment of the invention with reference to FIG. 5.

The method of manufacturing a porous glass substrate according to an embodiment of the invention includes, first, the step of preparing a glass substrate 201. Afterwards, at least one component of the glass substrate 201 except for silicon dioxide ($SiO_2$) is eluted from one surface of the glass substrate 201, thereby forming a porous layer 210 in at least one portion of one surface of the glass substrate 201, the refractive index of the porous layer 210 being smaller than that of the glass substrate 201.

Figure 5:
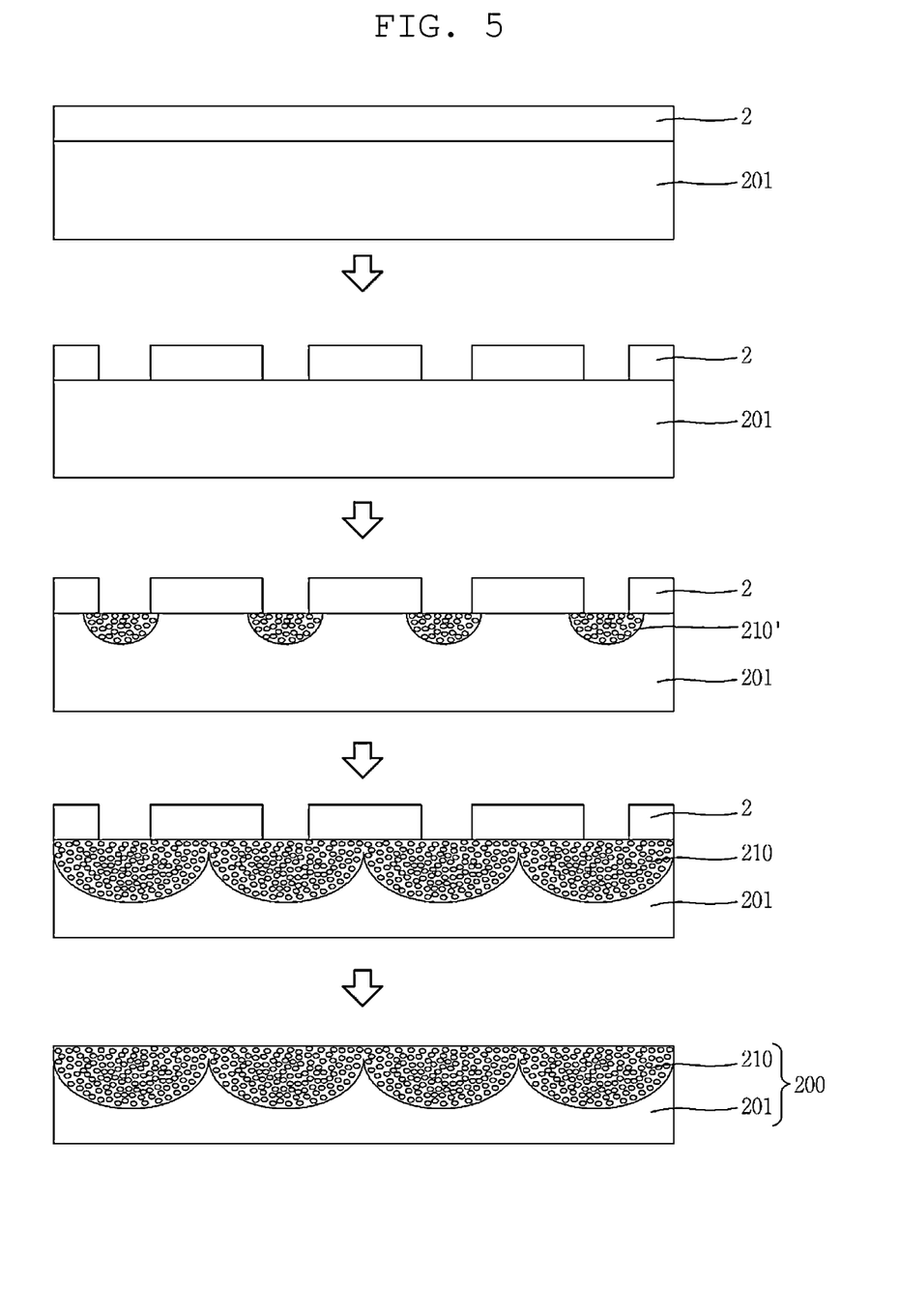
FIG. 5 is a process view showing a method of manufacturing a porous glass substrate according to an embodiment of the invention.

Here, as shown in FIG. 5, the porous layer 210 can be formed via lithography such that a concave-convex scattering pattern consisting of semi-oval shapes is formed in the inner surface of the porous layer 210. The process of forming the concave-convex pattern according to the invention is not limited to the lithography, since the concave-convex pattern can be formed by a variety of processes.

When the pattern of the porous layer 210 is formed by a well-known process of the variety of processes, first, resist (PR) 2 is applied on the surface of the glass substrate 201. Afterwards, the resist 2 is patterned using a mask (not shown) in order to expose a plurality of areas in the surface of the glass substrate 201 in which the porous layer 210 is to be formed. After that, when elution is conducted, porous patterns 210' are formed in the open areas of the glass substrate 201 that are exposed through the patterned resist such that the porous patterns 210' extend inward from one surface of the glass substrate 201. When the elution is conducted further, at least one component of the glass substrate 201 except for silicon dioxide ($SiO_2$) is eluted from portions of the glass substrate 201 below the resist 2, thereby forming a porous layer 210 which has a semi-oval concave-convex pattern in the inner surface thereof, as shown in FIG. 4. In sequence, the patterned resist is removed via stripping, thereby producing the porous layer 210 which has the semi-oval concave-convex pattern in the inner surface thereof, the refractive index thereof being lower than that of the glass substrate 201.

Although not shown in the figures, another lithograph process includes the step of applying a metal thin film made of one selected from among Ag, Au, Pt, Pd, Co, Ni, Ti, Al, Sn, Cr and alloys thereof to a thickness of several tens of nanometers on the glass substrate in order to form a pattern having random pitch sizes, followed by annealing the resultant structure at a temperature around the melting point of the metal thin film, so that the metal thin film forms hemispherical nano particles via dewetting. The metal nano particles can be used as a mask when patterning the porous layer and then be removed, thereby producing a substrate having the porous layer. A polymer thin film or an oxide can be used in place of the metal thin film.

Finally, although not shown in the figures, according to this embodiment of the invention, a buffer layer (not shown) made of porous glass can be stacked on one surface of the glass substrate 210 including the porous layer 210.

Figure 9:
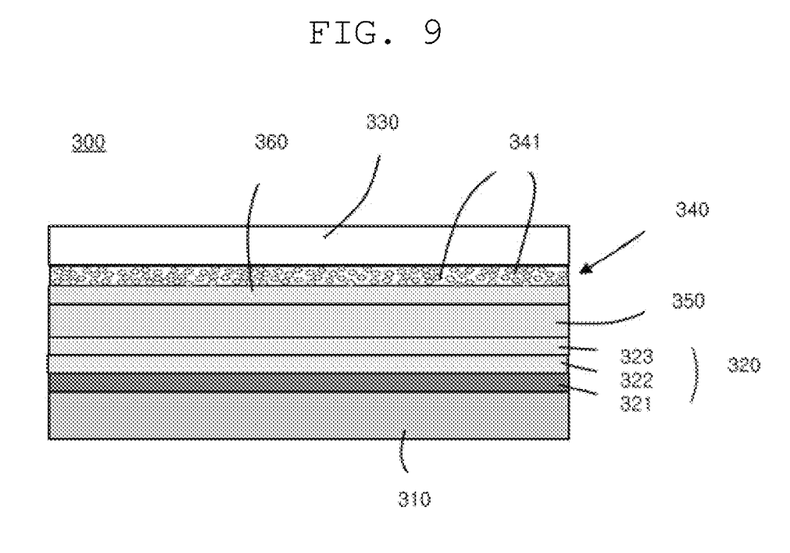
FIG. 9 is a cross-sectional view showing a top-emission type OLED according to a further embodiment of the invention.

FIG. 9 is a cross-sectional view showing a top-emission type OLED 300 according to a further embodiment of the present invention.

As shown in FIG. 9, the OLED 300 according to this embodiment of the present invention has a top emission structure which emits light toward a cathode 323. Here, the OLED 300 is connected to a thin-film transistor (not shown) so as to be driven thereby. The OLED 300 includes a first glass substrate 310, a device layer 320, a second glass substrate 330, a porous portion 340 and a bonding layer 350.

Unlike a bottom-emission type OLED, a top-emission type OLED is configured such that it emits light toward a cathode that is made of a transparent material having a low work function. The top-emission type OLED can have a higher aperture ratio than the bottom-emission type OLED, since the thin-film transistor which drives the top-emission type OLED is disposed under the OLED.

The first glass substrate 310 is a base substrate on which the device layer 320 is deposited. The first glass substrate 310 also serves as a protective substrate which protects the device layer from the external environment.

The device layer 320 is formed on the first glass substrate 310 using the first glass substrate 310 as the base substrate. The device layer 320 includes an anode 321, an organic light-emitting layer 322 and the cathode 323. The anode 321, the organic light-emitting layer 322 and the cathode 323 are sequentially stacked on the first glass substrate 310.

Since the OLED 300 according to this embodiment of the present invention has the top-emission structure, the anode 321 deposited on the first glass substrate 310 must be made of a material that reflects light generated by the organic light-emitting layer 322 in the direction toward the front surface, i.e. the cathode 323. In addition, the anode 321 must be made of a material that has a high work function in order to facilitate hole injection into the organic light-emitting layer 322. For instance, the anode 321 can be made of a metal such as Au, In or Sn, or be configured as a multilayer structure that includes a metal layer and a transparent electrode thin film made of an oxide such as indium tin oxide (ITO).

In addition, the cathode 323 is made of a material that has a low work function in order to facilitate electron injection into the organic light-emitting layer 322. In particular, since the OLED 300 according to this embodiment of the present invention has the top-emission structure, the cathode 323 can have a multilayer structure that includes a semitransparent electrode thin film made of a metal such as Al, Al:Li or Mg:Ag and a transparent electrode thin film made of an oxide such as ITO.

The second glass substrate 330 is disposed on the device layer 320 such that it faces the first glass substrate 310, and serves as an encapsulation glass which protects and isolates the inside device layer 320 from the external environment. According to an embodiment of the present invention, the second glass substrate 330 can serve as a passage through which light generated by the device layer 320 is emitted to the outside. The second glass substrate 330 can be made of a glass, the composition of which is identical to that of the first glass substrate 310.

Here, the second glass substrate 330 can be bonded to the device layer 320 via the bonding layer 350. According to an embodiment of the present invention, the bonding layer 350 can be made of, for example, an optical clear adhesive (OCA) film, since light generated by the device layer 320 must be efficiently transmitted to the second glass substrate 330.

The porous portion 340 is formed in one surface (i.e. the undersurface in FIG. 9) of the second glass substrate 330, and extends into the second glass substrate 330. As shown in FIG. 9, the porous portion 340 is formed in the one surface of the second glass substrate 330 which faces the device layer 320, and extends into the second glass substrate 330.

The porous portion 340 has a plurality of pores 341 which are formed inside the second glass substrate 330. According to this embodiment of the present invention, the plurality of pores 341 is distributed in the entire area of the one surface of the second glass substrate 330. Accordingly, the porous portion 340 consisting of the plurality of pores 341 forms a porous layer between the portion of the second substrate 330 in which the pores 341 are not formed and the bonding layer 350.

Since the porous portion 340 is provided, the light extraction efficiency and luminance of the top-emission type OLED 300 according to this embodiment of the present invention can be improved. This can consequently reduce power consumption, leading to minimized heat generation, thereby increasing the lifespan of the OLED. In addition, unlike the related art in which the porous portion is separately formed to serve as a light extraction layer, the porous portion 340 according to this embodiment of the present invention is formed in the second glass substrate 330 which serves as the encapsulation glass. Accordingly, the OLED 300 according to this embodiment of the present invention can have a simpler structure than the OLED of the related art, thereby realizing structural stability. In addition, a display device which employs this OLED 300 can have a slim and compact profile.

According to an embodiment of the present invention, a buffer layer 360 can be formed between the second glass substrate 330 and the bonding layer 350, more particularly, between the porous portion 340 which forms the lower layer of the second glass substrate 330 (with respect to the drawing surface) and the buffer layer 350. The buffer layer 360 is a layer which serves to block an element, such as alkalis, which can diffuse across the second glass substrate 330 in which the porous portion 340 is formed and have negative effects on the device layer 320 and devices, such as a thin-film transistor, which are provided in the lower portion (not shown) of the OLED 300 in order to drive the device layer 320. The buffer layer 360 also serves to prevent a material of the bonding layer 350 from penetrating into the porous portion 340.

Figure 10:
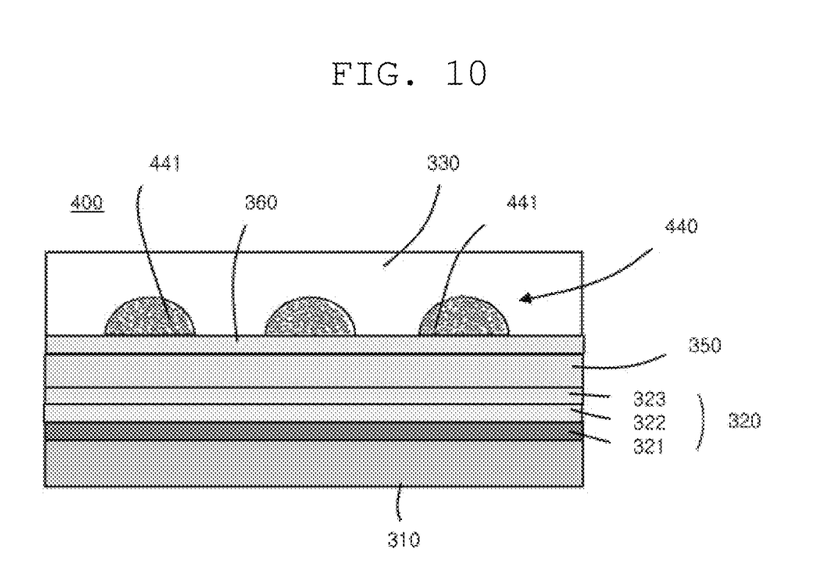
FIG. 10 is a cross-sectional view showing a top-emission type OLED according to further another embodiment of the invention.

FIG. 10 is a cross-sectional view showing a top-emission type OLED 400 according to further another embodiment of the present invention.

As shown in FIG. 10, the top-emission type OLED 400 according to this embodiment of the present invention includes a first glass substrate 310, a device layer 320, a second glass substrate 330, a porous portion 440 and a bonding layer 350.

The porous portion 440 according to this embodiment of the present invention has a plurality of pores 341 formed inside the second glass substrate 330. Unlike the plurality of pores 341 according to the former embodiment shown in FIG. 9 which are distributed all over one surface of the second glass substrate to form a layer, the plurality of pores 441 of the porous portion 440 are distributed in predetermined portions of one surface (i.e. the undersurface in FIG. 10) of the second glass substrate 330. As shown in FIG. 10, the porous portion 440 has a concave-convex pattern consisting of a plurality of semi-oval shapes.

Here, it is preferred that the pitch of the semi-oval concave-convex pattern be equal to or greater than about 1 μm which is greater than the wavelength of light emitted from the device layer 320, or be equal to or smaller than about 200 nm which is smaller than the wavelength of the emitted light. When the size of each semi-oval shape of the concave-convex pattern is similar to the wavelength of the emitted light, it is preferred that the size of the pitch of the semi-oval concave-convex pattern be random within the range of the wavelength of the light The concave-convex pattern consisting of a plurality of semi-oval shapes can be formed, for example, via photolithography, interference lithography or electron beam (E-beam) lithography, or using a dewetting mask.

The foregoing descriptions of specific exemplary embodiments of the present invention have been presented with respect to the certain embodiments and drawings. They are not intended to be exhaustive or to limit the invention to the precise forms disclosed, and obviously many modifications and variations are possible for a person having ordinary skill in the art in light of the above teachings.

It is intended therefore that the scope of the invention not be limited to the foregoing embodiments, but be defined by the Claims appended hereto and their equivalents.

What is claimed is:

1. A porous glass substrate comprising:
    a glass substrate; and
    a porous layer formed in at least one portion of one surface of the glass substrate and extending into the glass substrate, a refractive index of the porous layer being smaller than a refractive index of the glass substrate,
    wherein the porous layer has a concave-convex pattern in a surface thereof which faces toward an inside of the glass substrate.

2. The porous glass substrate of claim 1, wherein the porous layer comprises a plurality of pores which is formed in the glass substrate such that at least one component of the glass substrate is eluted from the glass substrate.

3. The porous glass substrate of claim 2, wherein the at least one component excludes silicon dioxide.

4. The porous glass substrate of claim 1, wherein the concave-convex pattern has a plurality of semi-oval shapes.

5. The porous glass substrate of claim 1, wherein a pitch of the concave-convex pattern is equal to or greater than 1 μm or is equal to or less than 200 nm.

6. The porous glass substrate of claim 1, wherein a pitch of the concave-convex pattern has random different sizes.

7. The porous glass substrate of claim 1, further comprising a buffer layer stacked on the one surface of the glass substrate, the buffer layer being made of porous glass.

8. The porous glass substrate of claim 7, wherein the buffer layer comprises one selected from among $SiO_2$, $SiN_x$, MgO and $ZrO_2$.

9. A method of manufacturing a porous glass substrate, comprising:
    preparing a glass substrate; and
    forming a porous layer in at least one portion of one surface of the glass substrate by eluting at least one component of the glass substrate from the glass substrate, a refractive index of the porous layer being smaller than a refractive index of the glass substrate,
    wherein the porous layer comprises a concave-convex pattern in a surface thereof which faces toward an inside of the glass substrate.

10. The method of claim 9, wherein the concave-convex pattern is formed via lithography.

11. The method of claim 10, wherein the lithography comprises a photolithography process which includes:
    applying photoresist on the one surface of the glass substrate;
    exposing a plurality of areas on the one surface of the glass substrate by patterning the photoresist using a mask;
    forming the porous layer in an inward direction from the plurality of areas by carrying out elution in the plurality of areas; and
    removing the patterned photoresist.

12. The method of claim 10, wherein the lithography comprises:
    coating the one surface of the glass substrate with a coating material;
    forming semispherical nano particles by annealing at a temperature near a melting point of the coating material;
    patterning the one surface of the glass substrate using the nano particles as a mask so that the porous layer is formed; and
    removing the nano particles.

13. The method of claim 12, wherein the coating material comprises one selected from the group consisting of Ag, Au, Pt, Pd, Co, Ni, Ti, Al, Sn, Cr and alloys thereof.

14. The method of claim 12, wherein the coating material comprises a polymer or an oxide.

15. A top-emission type organic light-emitting device comprising:
   a first glass substrate;
   a device layer comprising an anode, an organic light-emitting layer and a cathode which are sequentially stacked on the first glass substrate;
   a second glass substrate disposed on the device layer such that the second glass substrate faces the first glass substrate, the second glass substrate forming a passage through which light generated by the device layer is emitted to an outside;
   a porous portion formed in at least a portion of one surface of the second glass substrate and extending into the second glass substrate, a refractive index of the porous portion being smaller than a refractive index of the glass substrate; and
   a bonding layer disposed between the device layer and the second glass substrate to bond the device layer and the second glass substrate to each other.

16. The top-emission type organic light-emitting device of claim 15, wherein the one surface of the second glass substrate is a surface that faces the device layer.

17. The top-emission type organic light-emitting device of claim 15, wherein the porous portion comprises a plurality of pores which is formed in the second glass substrate such that at least one component of the second glass substrate is eluted from the second glass substrate.

18. The top-emission type organic light-emitting device of claim 15, wherein the porous portion comprises a porous layer which is formed in an entire area of the one surface of the second glass substrate.

19. The top-emission type organic light-emitting device of claim 15, wherein the porous portion comprises a concave-convex pattern which is formed in predetermined portions of the one surface of the second glass substrate.

20. The top-emission type organic light-emitting device of claim 15, further comprising a buffer layer disposed between the second glass substrate and the bonding layer.

21. The top-emission type organic light-emitting device of claim 20, wherein the buffer layer is made of one selected from the group consisting of $SiO2$, $Si_xN_y$, $Nb_2O_5$, $MgO$ and $ZrO_2$.

* * * * *